(12) United States Patent
Hsieh et al.

(10) Patent No.: US 8,010,876 B2
(45) Date of Patent: Aug. 30, 2011

(54) METHOD OF FACILITATING RELIABLE ACCESS OF FLASH MEMORY

(75) Inventors: Jen-wei Hsieh, Taipei (TW); Tei-wei Kuo, Taipei (TW); Hsiang-chi Hsieh, Sindian (TW)

(73) Assignee: Genesys Logic, Inc., Taipei (TW)

( * ) Notice: Subject to any disclaimer, the term of this patent is extended or adjusted under 35 U.S.C. 154(b) by 914 days.

(21) Appl. No.: 11/965,076

(22) Filed: Dec. 27, 2007

(65) Prior Publication Data

US 2008/0163031 A1 Jul. 3, 2008

(30) Foreign Application Priority Data

Dec. 28, 2006 (TW) ................................ 95149553 A

(51) Int. Cl.
*G11C 29/00* (2006.01)
(52) U.S. Cl. ............. 714/773; 714/2; 714/6.24; 714/52; 714/701; 714/746; 714/755; 714/758; 714/774; 714/807; 365/185.09
(58) Field of Classification Search .................. None
See application file for complete search history.

(56) References Cited

U.S. PATENT DOCUMENTS

| | | | |
|---|---|---|---|
| 5,754,567 A * | 5/1998 | Norman | 714/773 |
| 6,222,763 B1 | 4/2001 | Sato et al. | |
| 6,311,304 B1 * | 10/2001 | Kwon | 714/755 |
| 6,990,623 B2 | 1/2006 | Furukawa | |
| 7,333,364 B2 * | 2/2008 | Yu et al. | 365/185.09 |
| 7,810,017 B2 * | 10/2010 | Radke | 714/769 |
| 7,899,980 B2 * | 3/2011 | Kwon | 711/103 |
| 2005/0028067 A1 * | 2/2005 | Weirauch | 714/758 |
| 2005/0144551 A1 | 6/2005 | Nahas | |
| 2006/0087456 A1 | 4/2006 | Luby | |
| 2008/0016428 A1 * | 1/2008 | Lee et al. | 714/763 |
| 2008/0034269 A1 * | 2/2008 | Hwang et al. | 714/756 |
| 2008/0282106 A1 * | 11/2008 | Shalvi et al. | 714/6 |

* cited by examiner

*Primary Examiner* — John Trimmings
(74) *Attorney, Agent, or Firm* — Kirton & McConkie; Evan R. Witt

(57) ABSTRACT

A method of facilitating reliably accessing flash memory is provided. During the write-in process, the present invention utilizes the steps of coding write-in data to generate extra data, and then generating the first error correction code by performing an error-correcting operation on the write-in data and the extra data. Finally, store the N write-in data and the generated K extra data into the data area and the first ECC into the spare area. During read process, the present invention utilizes the steps of reading data from the data area of the target flash-memory page to generate the second ECC, counting with the counter a number of bit differences between the first ECC and the second ECC, and selecting M data from the N write-in data and the K extra data as decoding factors to retrieve the N write-in data. The higher the counter values, the lower the likelihood the corresponding bit is selected to be retrieved.

7 Claims, 10 Drawing Sheets

METHOD OF FACILITATING RELIABLE ACCESS OF FLASH MEMORY

BACKGROUND OF THE INVENTION

1. Field of the Invention

The present invention relates to a method capable of facilitating reliably accessing flash memory, and more particularly, a method capable of facilitating reliably accessing flash memory by coding on writing process, decoding on reading process and comparing the first and the second error correction codes.

2. Description of the Related Art

Flash memory is widely used in a computer host or consumer electronic products, such as USB portable devices, MP3 players. However, considering the present technology, flash memory block may fail to access when in excess of 100,000 times of erasures and the block is considered to be worn out.

On account of a limited life of flash memory, it is an important subject to accurately read out data when some flash-memory block is worn out. There are two kinds of resolutions: One resolution utilizes improvements of hardware to facilitate the reliability of flash memory; the other resolution is to correct errors by means of Error Correction Code (ECC), yet this is limited to the size of spare area of flash-memory page. Regarding a page of 512 bytes, a 24-bit ECC is essential for detection of 2 bits error, and correction of 1 bit error. That is, few bits are allowed to be erred, thereby restricting the ability to error-correcting, and reliability and efficiency of data access.

As shown in FIG. 1 depicting a structure of a conventional flash-memory page, when data A1 is written into data area A2, an ECC A3 is simultaneously stored into the spare area A4. It is more unreliable for such structure for use in a Multi-Level Cell (MLC) flash memory. Despite a cell of the MLC flash memory could store two or more bits, but this raises the possibility of misreading the values of bits. Although expanding a used number of spare area to supply more ECC space may improve above-mentioned problem, a substantial investment for upgrading present system and hardware is also necessary; therefore, it is not beneficial in doing this way.

Furthermore, for efficient usage of flash memory, one way is to monitor times of erasure to each flash block. If the number of erasure times for a block is close to 100,000, data will not be overwritten into the block. Monitoring each block must utilize substantial system resources and memory capacity, but not all blocks will be worn out when erased over 100,000 times, on the contrary, part blocks may not be accessible, as erased with less than 100,000 times. In other words, monitoring each block fails to completely reflect whether each block is useable, and possibly resulting in a waste of flash memory because of suspicious reliability.

Despite Taiwan Patent No. 575806 proposes an enhancement to error correction of flash memory, yet it still does not overcome the problem of low tolerance of two bits and failure to reflect whether each block is useable. Therefore, the situation of misreading remains.

SUMMARY OF THE INVENTION

Accordingly, a primary objective of the present invention is to provide a method of facilitating reliably accessing flash memory, so that a greater number of bits of flash memory are allowed for fault tolerance.

According to the present invention, a method of facilitating reliably accessing flash memory comprises the steps of:

(a) determining whether data is to be read out or write in;

(b) if the result of step (a) is to write-in, coding a number of N write-in data to generate a number of K extra data, generating the first error-correction code by using an error-correcting operation to the N+K data, and storing the N write-in data and the generated K extra data into the data area and the first ECC into the spare area; and (c) if the result of step (a) is to read-out, allocate a plurality of counters in the main memory;

(d) each bit in the target page's data area corresponds to a counter for accumulating a number of differences between the first and the second error correction codes (ECCs) associated to the target page;

(e) reading data from the data area of the target page to generate the second ECC and reading the first ECC from the spare area of the target page. Compare each bit in the first and the second ECC, each bit dominates a set of bits in the data area. If a bit in the first and the second ECC disagree, counters corresponding to the bit are increased by 1. Preferring those data with smaller counter values, select a number of M data from the N write-in data and the K extra data as decoding factors to retrieve the N write-in data by using reverse operation of original adopted operation of coding in step (b).

In one aspect of the present invention, the step (b) of the present invention comprises:

(b1) coding the N write-in data by using coding operation to generate the K extra data;

(b2) performing error-correcting with the N write-in data and the K extra data to generate the first error correction code; and (b3) storing the N write-in data and the K extra data into a data area 111 of the assigned flash-memory page, and storing the first ECC into the spare area 112 of the assigned flash-memory page.

In another aspect of the present invention, the step (e) comprises:

(e1) reading the N write-in data and the K extra data stored in the data area and the corresponding first error correction code in the spare area;

(e2) selecting a number of M data from the N write-in data and K extra data as factors for data retrieving;

(e3) retrieving the N write-in data $D_1 \sim D_n$ by decoding the selected M data;

(e4) determining whether the decoded data is correct? If it is, go to step (e6), if not go to step (e5);

(e5) determining whether the repeated times over a threshold regarding to an upper limitation of misreading? If it is, go to step (e51), if not, go to step (e52);

(e51) alarm a failure of reading operation of the flash-memory page; and (e52) selecting another set of M data from the N write-in data $D_1 \sim D_n$ and K extra data $T_1 \sim T_k$ stored in the data area; and (e6) returning the correct data.

In still another aspect of the present invention, the step (e2) comprises:

(e21) clearing the counter corresponding to each bit in the data area of the target flash-memory page;

(e22) reading the N write-in data and the K extra data stored in the data area 111 of the target flash-memory page;

(e23) reading the first ECC stored in the spare area of the target flash-memory page;

(e24) calculating the second ECC based on the N write-in data and K extra data;

(e25) comparing the first ECC and the second ECC bit by bit;
(e26) determining whether the compared bit of the first ECC and second ECC are identical, if it is, go to step (e262), if not, go to step (e261);
(e261) For those bits in the data area dominated by the ECC bit, adding the values of their corresponding counters by one;
(e262) determining whether the compared bit is the last bit, if it is, go to step (e27), if not, go to step (e263);
(e263) keeping on a comparison of the next bit; and
(e27) preferring those data with smaller counter values, randomly select a number of M data. Note that in step (e52), it might be required to select another set of M data. We must ensure that each time the selection of a number of M data differs. This could be done by given different weight to counter values and take other factors into consideration.

The present invention will be described with reference to the accompanying drawings, which show exemplary embodiments of the present invention.

DETAILED DESCRIPTION OF THE INVENTION

Figure 1:
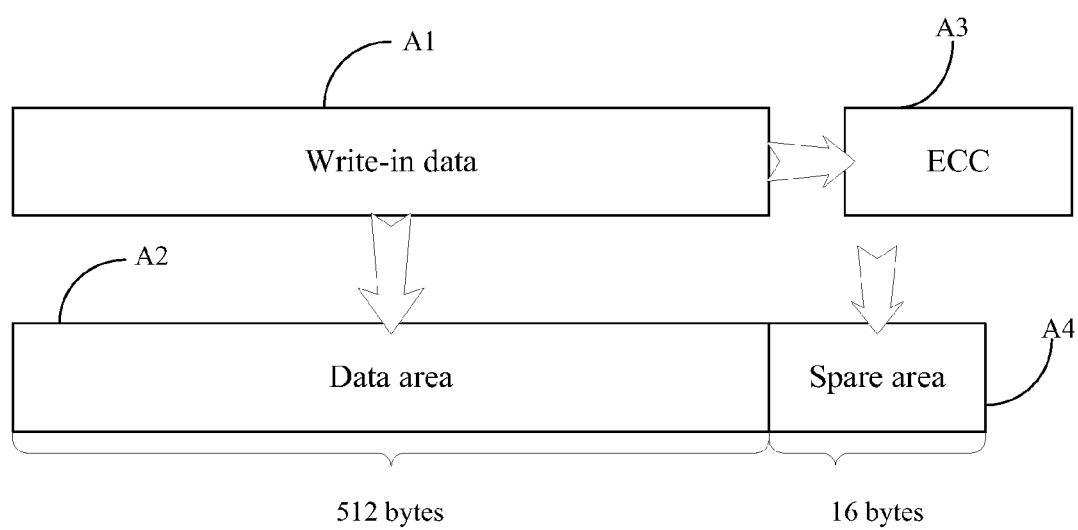
FIG. 1 depicts a structure of a conventional flash-memory page.
Figure 2:
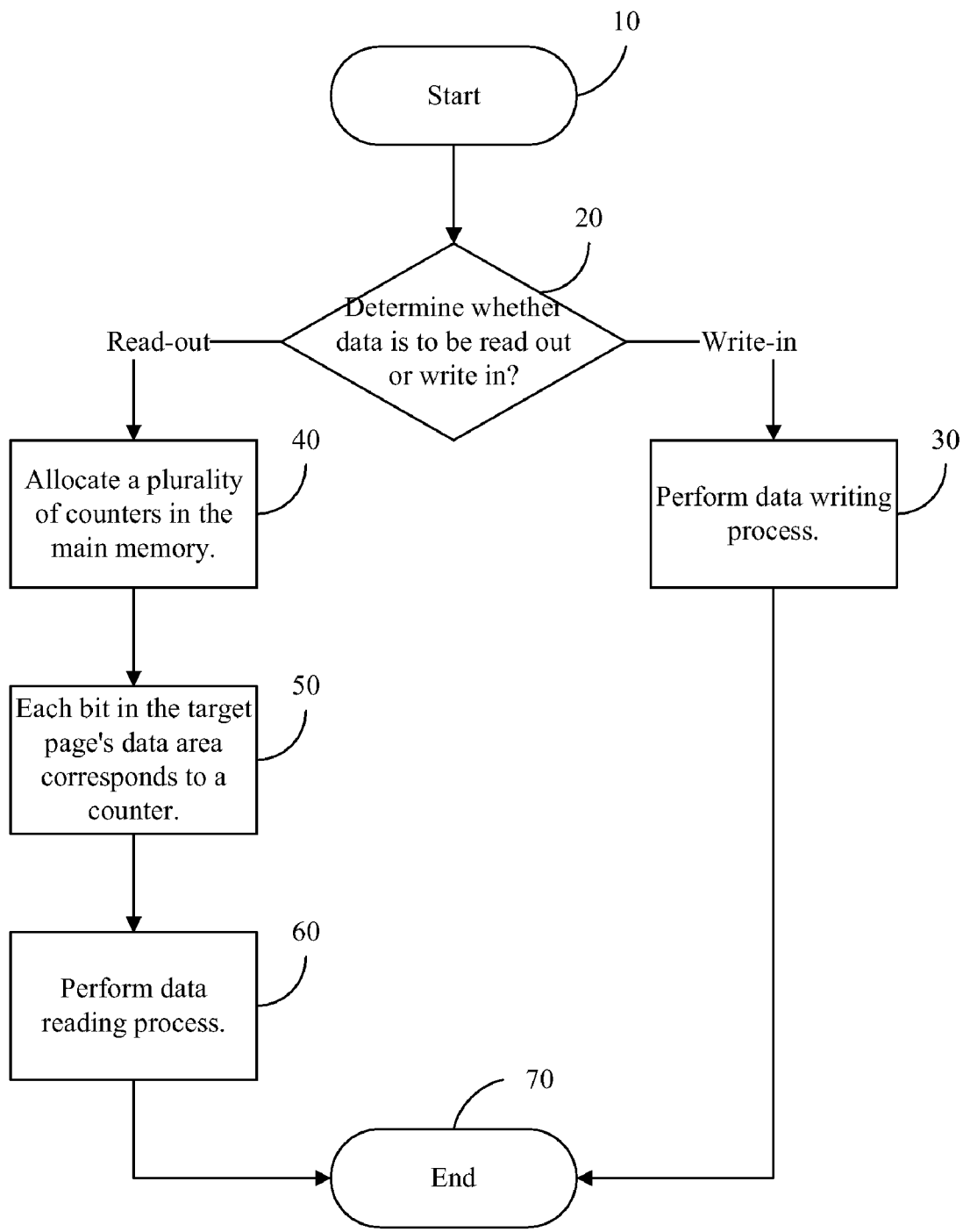
FIG. 2 illustrates a flowchart of a method of accessing data of flash memory according to the present invention.
Figure 3:
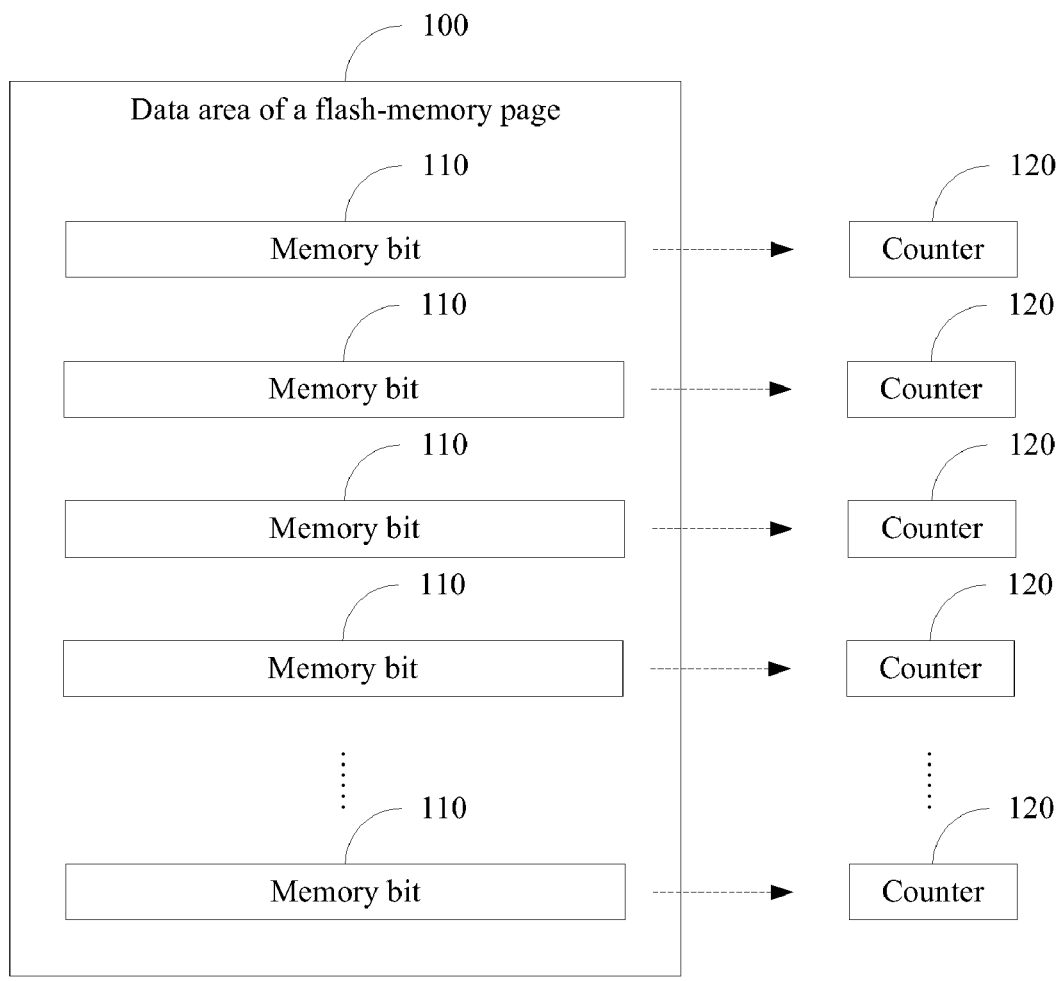
FIG. 3 shows a structure diagram of the flash-memory bits and the corresponding counters according to the present invention.
Figure 4:
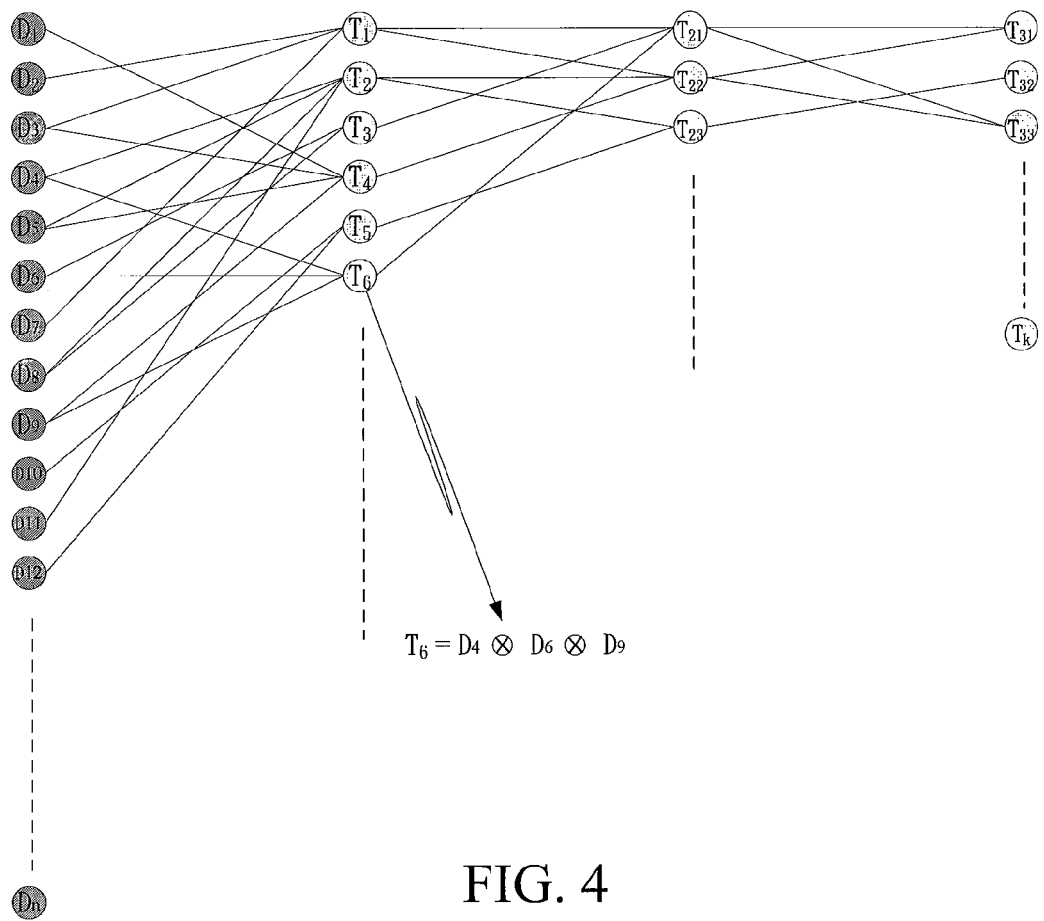
FIG. 4 shows a schematic diagram of coding the write-in data to generate the extra data.
Figure 5:
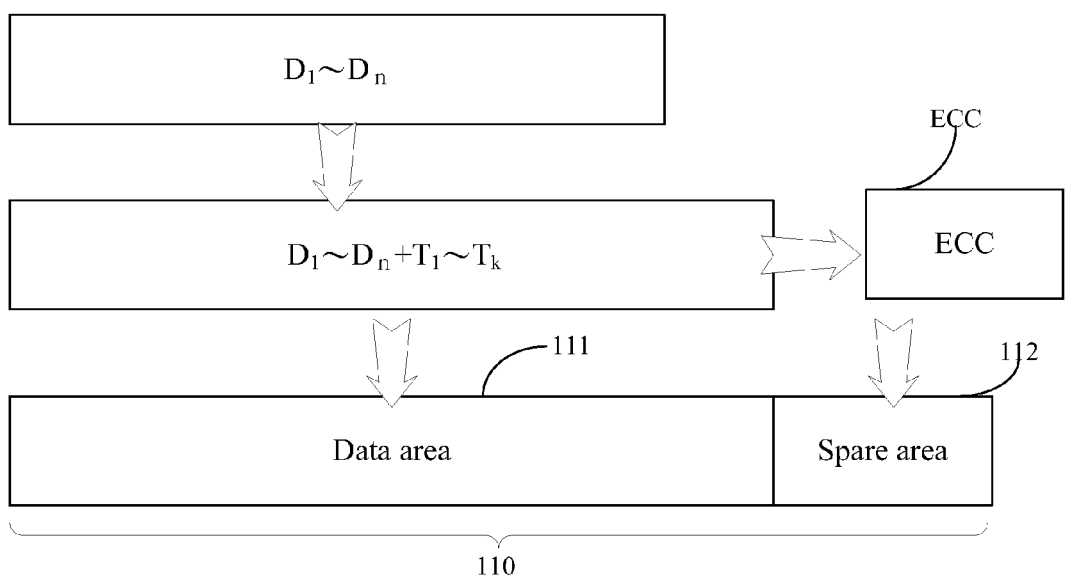
FIG. 5 depicts a data structure of the data area and spare area of a flash-memory page in accordance with the present invention.

Please refer to FIGS. 2, 3, 4, and 5. FIG. 2 illustrates a flowchart of a method of accessing data of flash memory according to the present invention. The method occurs as follows:
(10) Start.
(20) Determine whether data is to be read out or write in. If it is to be read out, go to step 40; otherwise, go to step 30.
(30) Coding write-in data, with reference to FIG. 4, is performed. A number of N write-in data $D_1$~$D_n$ is coded by using some coding technique, e.g., Tornado coding technique in this embodiment, to generate a number of K extra data $T_1$~$T_k$, where N>K. Each K extra data $T_1$~$T_k$ is obtained by using exclusive OR operation of part of N write-in data $D_1$~$D_n$. For example, $T_6 = D_4 \otimes D_6 \otimes D_9$. It is noted that other logical operation used for the coding also belong to the scope of the present invention. An ECC is produced by using error-correcting operation with N write-in data $D_1$~$D_n$ and K extra data $T_1$~$T_k$.

Thereafter, the N write-in data $D_1$-$D_n$ and K extra data $T_1$~$T_k$ are stored in data area 111 of the flash-memory page 110, and the ECC is stored in the spare area 112. As long as a number of M data is randomly selected from the N write-in data $D_1$~$D_n$ and K extra data $T_1$~$T_k$, where N<M<N+K, the N write-in data $D_1$~$D_n$ can be retrieved by decoding the M random-selected data. The ECC, which is traditionally used to correct 1-bit error, is now used to help selecting a number of M data according to the present invention.
(40) Allocate a plurality of counters 120 in main memory. The plurality of counters 120 are composed of a counter array in characteristic of sequential addresses.
(50) Each bit 1111 in the target flash-memory page's data area corresponding to a counter 120 which is used for accumulating a number of differences between the first and the second ECCs of the target flash-memory page 100.
(60) Reading data from the data area 111 of the target flash-memory page 110 is performed to generate the second ECC. The counter 120 counts a number of dominating bits differences between the second ECC and the first ECC stored in the spare area 112. The values of counts are as a criterion of improving reliably accessing each page 110 of flash memory 100. A reliable data group, i.e., the number of M data, is randomly selected from N write-in data $D_1$~$D_n$ and K extra data $T_1$-$T_k$ as decoding factors. Then N write-in data $D_1$~$D_n$ is retrieved by using exclusive OR operation or reverse operation of original adopted operation for the selected M data.
(70) End.

Figure 6:
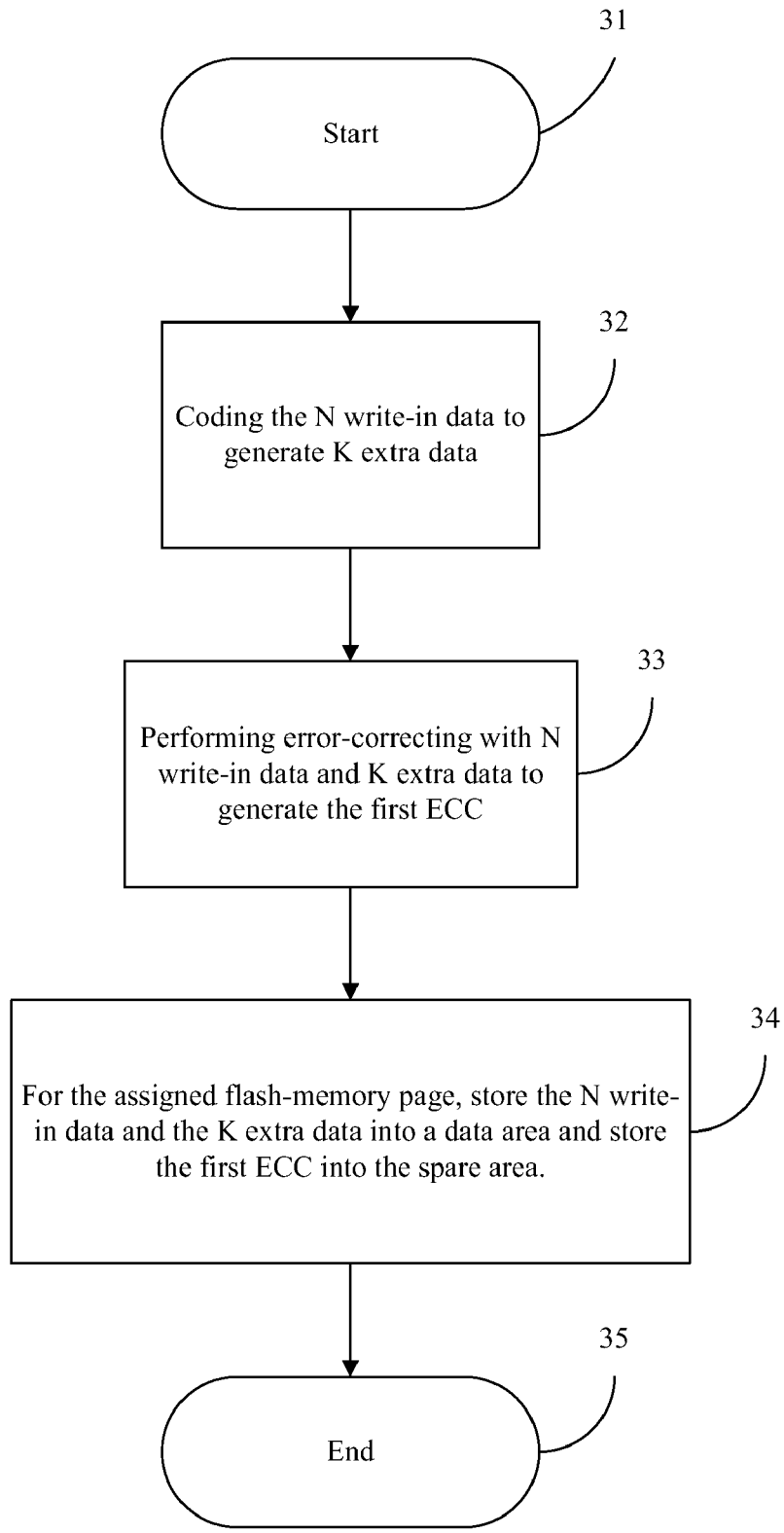
FIG. 6 illustrates a flowchart of writing process of step 30 in FIG. 2.

Referring to FIG. 6 illustrating a flowchart of writing process of accessing data in flash memory according to the present invention, i.e., detailed flowchart of step 30 in FIG. 2, it occurs as follows:
(31) Start.
(32) Coding the N write-in data $D_1$~$D_n$ by using coding operation to generate K extra data $T_1$-$T_k$ is performed.
(33) Performing error-correcting with N write-in data $D_1$~$D_n$ and K extra data $T_1$-$T_k$ to generate the first ECC.
(34) The N write-in data $D_1$~$D_n$ and K extra data $T_1$-$T_k$ generated from step 32 are stored into the data area 111 of the assigned flash-memory page 110, while the first ECC generated from step 33 is stored into the spare area 112 of the assigned flash-memory page 110.
(35) End.

Figure 7:
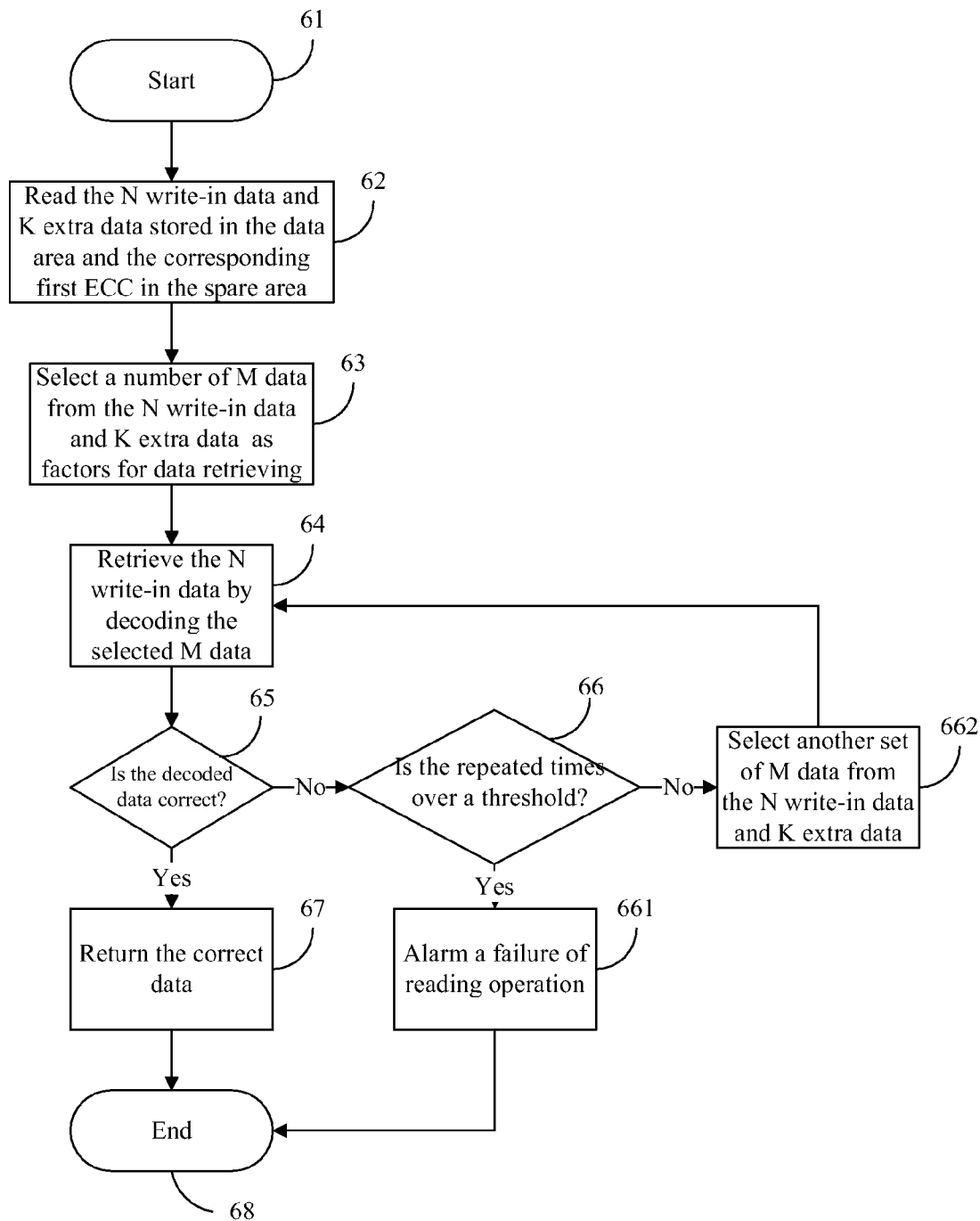
FIG. 7 illustrates a flowchart of a reading process of step 60 in FIG. 2 according to the present invention.

Referring to FIG. 7 illustrating a flowchart of a reading process of accessing data from flash memory according to the present invention, i.e., detailed flowchart of step 60 in FIG. 2, it occurs as follows:
(61) Start.
(62) Read the N write-in data $D_1$~$D_n$ and K extra data $T_1$~$T_k$ stored in the data area 111 and the corresponding first ECC from spare area 112.
(63) Select a number of M data from the N write-in data $D_1$~$D_n$ and K extra data $T_1$~$T_k$ as factors for data retrieving.
(64) Retrieve the N write-in data $D_1$~$D_n$ by decoding the selected M data in step 63.
(65) Is the decoded data is correct? If it is, go to step 67, if not, go to step 66.
(66) Is the repeated times over a threshold regarding to an upper limitation of misreading? If it is, go to step 661, if not, go to step 662.
(661) Alarm a failure of reading operation of the flash-memory page 110.

(662) Select another set of M data from the N write-in data $D_1 \sim D_n$ and K extra data $T_1 \sim T_k$ stored in the data area 111, and then back to step 64.

(67) Return the correct data.

(68) End.

Figure 8:
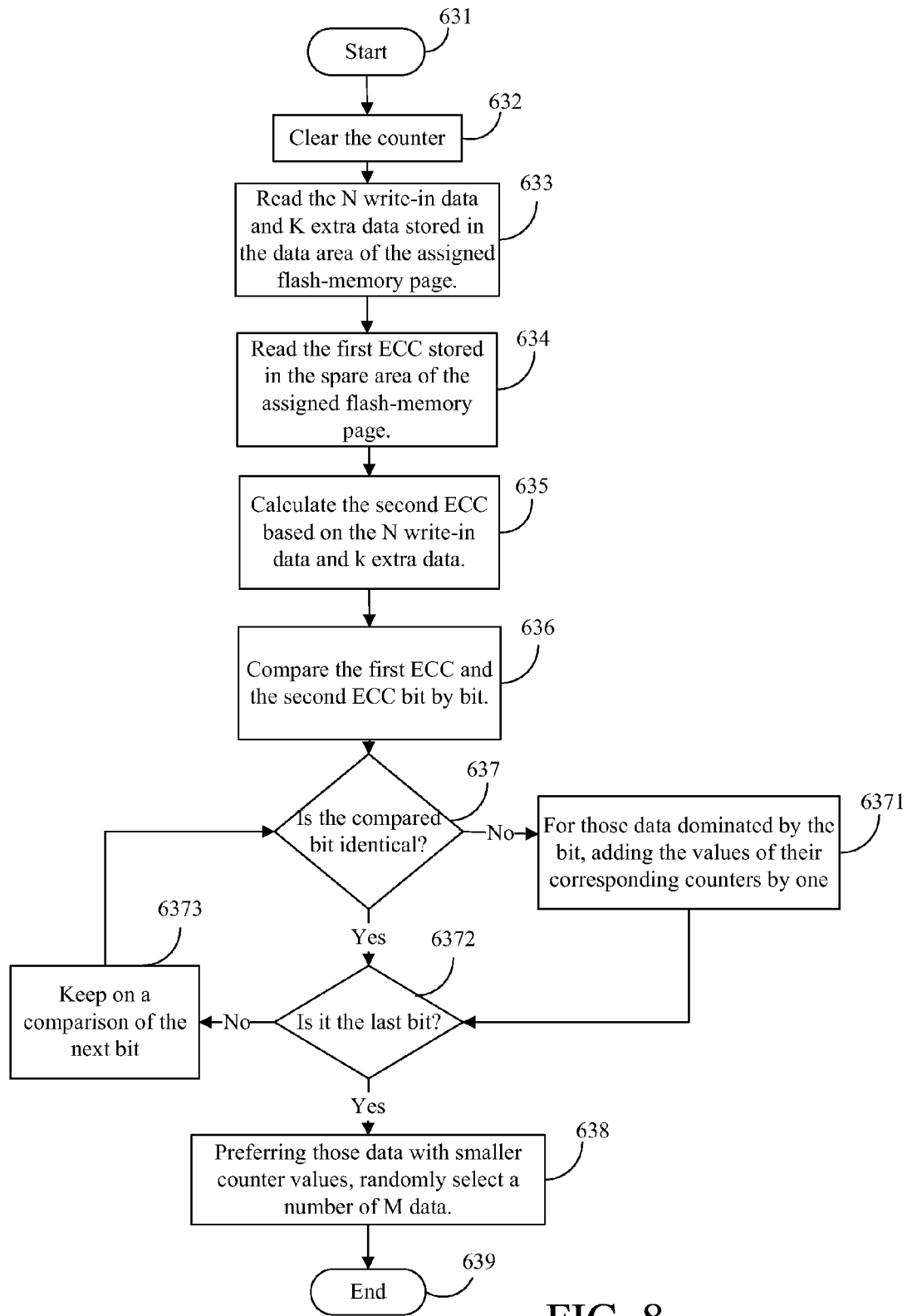
FIG. 8 illustrates a detailed flowchart of step 63 in FIG. 7.

With reference to FIG. 8 illustrating a detailed flowchart of step 63 in FIG. 7, it occurs as follows:

(631) Start.

(632) Clearing the counter 120 corresponding to each bit 1111 in the data area 111 of a flash-memory page 110 is performed.

(633) Read the N write-in data $D_1 \sim D_n$ and K extra data $T_1 \sim T_k$ stored in the data area 111 of the assigned flash-memory page 110.

(634) Read the first ECC stored in the spare area 112 of the assigned flash-memory page 110.

(635) Calculate the second ECC based on the N write-in data $D_1 \sim D_n$ and K extra data $T_1 \sim T_k$ of step 633.

(636) Compare the first ECC of step 634 and the second ECC of step 635 bit by bit.

(637) Is the content of the compared bits identical? If it is, go to step 6372, if not, go to step 6371.

(6371) Since each bit dominates a set of data, add the value of those counters corresponding to the bit by one.

(6372) Is it the last bit? If it is, go to step 638, if not, go to step 6373.

(6373) Keeping on a comparison of the next bit is performed.

(638) preferring those data with smaller counter values, randomly select a number of M data. Note that in step (662), it might be required to select another set of M data. We must ensure that each time the selection of a number of M data differs. This could be done by given different weight to counter values and take other factors into consideration.

(639) End.

Figure 9:
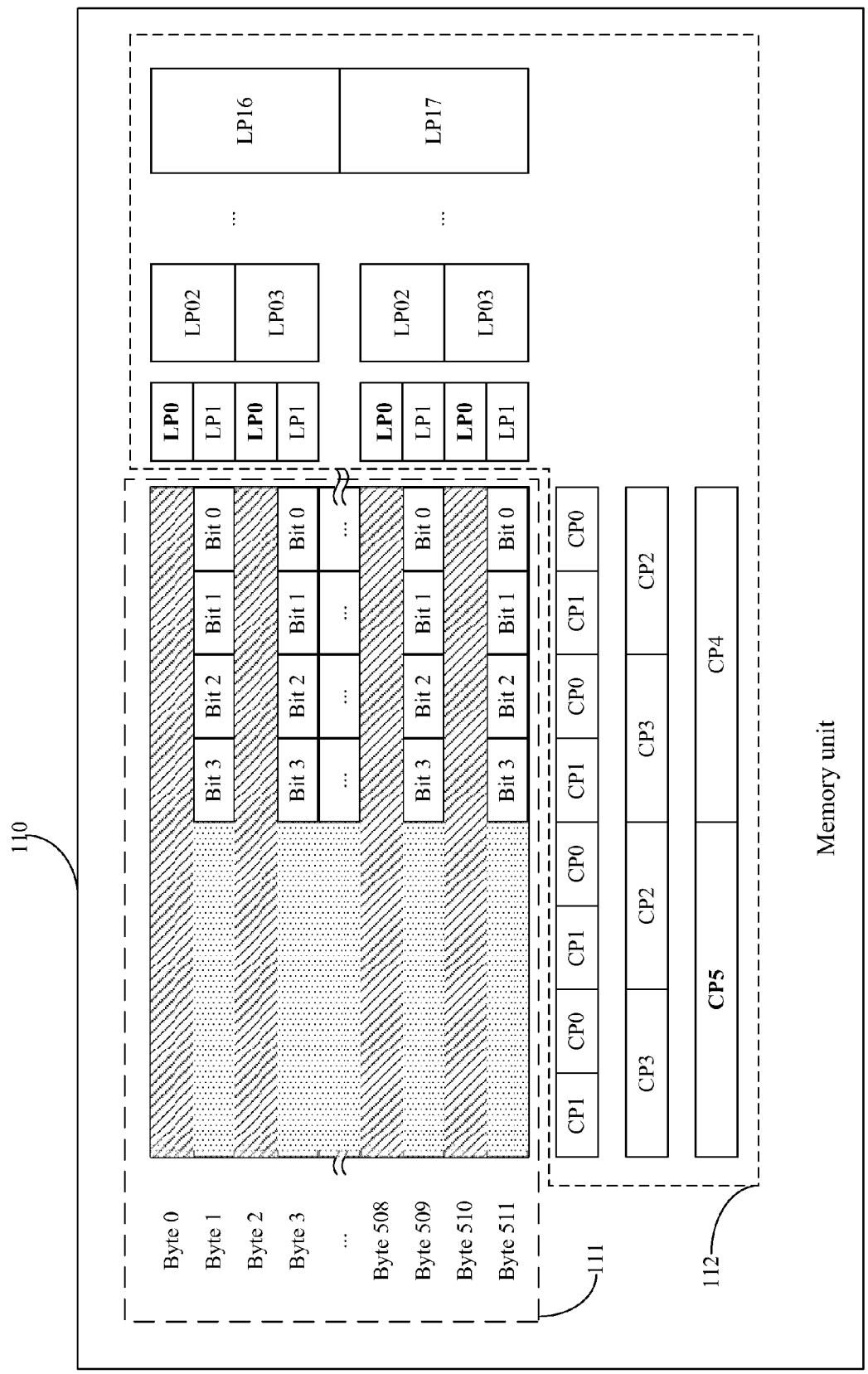
FIG. 9 shows an example of a traditional way to generate the error-correction code.

Please refer to FIG. 9 which shows an example of a traditional way to generate the error-correction code. In FIG. 9, the data area 111 is 512 bytes, and the spare area 112 is 16 bytes, which includes an error correction code of 24 bits (bit LP0~LP17 and bit CP0~CP5). Such error-correction code detects two error bits and corrects one error bit. Each ECC bit dominates a set of bits in data area 111, for instance, LP0 indicating to the result of exclusive-OR operating with all bits within Bytes 0, Byte 2, Byte 4, . . . , Byte 510. Thereafter, during reading process, the first ECC stored in the spare area 112 compares with the second ECC calculated on a basis of the data stored in data area 111, so as to determine whether the first ECC is identical to the second ECC and thus being the basis for selecting M data.

Preferably, the data area of a single-level cell flash-memory page 111 is 512 bytes, and the corresponding ECC is 24 bits. The counter 120 corresponding to a bit in the data area may record a value between 0~12 (4 bits is required). Each bit in data area 111 of 512×8 bits corresponding to one counter 120 amounts to 16 KB.

When any bit difference between the first and the second ECCs is detected, the corresponding counters 120 will add the count value with 1.

As shown in FIG. 9, if the bit LP0 corresponding to the first and of the second ECCs are different, the bits marked with oblique area may be erred. Similarly, if the value of bit CP5 is not identical, the bits marked with doted area may be erred. Therefore, the larger the overlapped area is, the higher the error possibility is. Consequently, after all ECCs are compared, the higher the counter 120 counts, the lower the likelihood the corresponding bit is selected to be retrieved.

Figure 10:
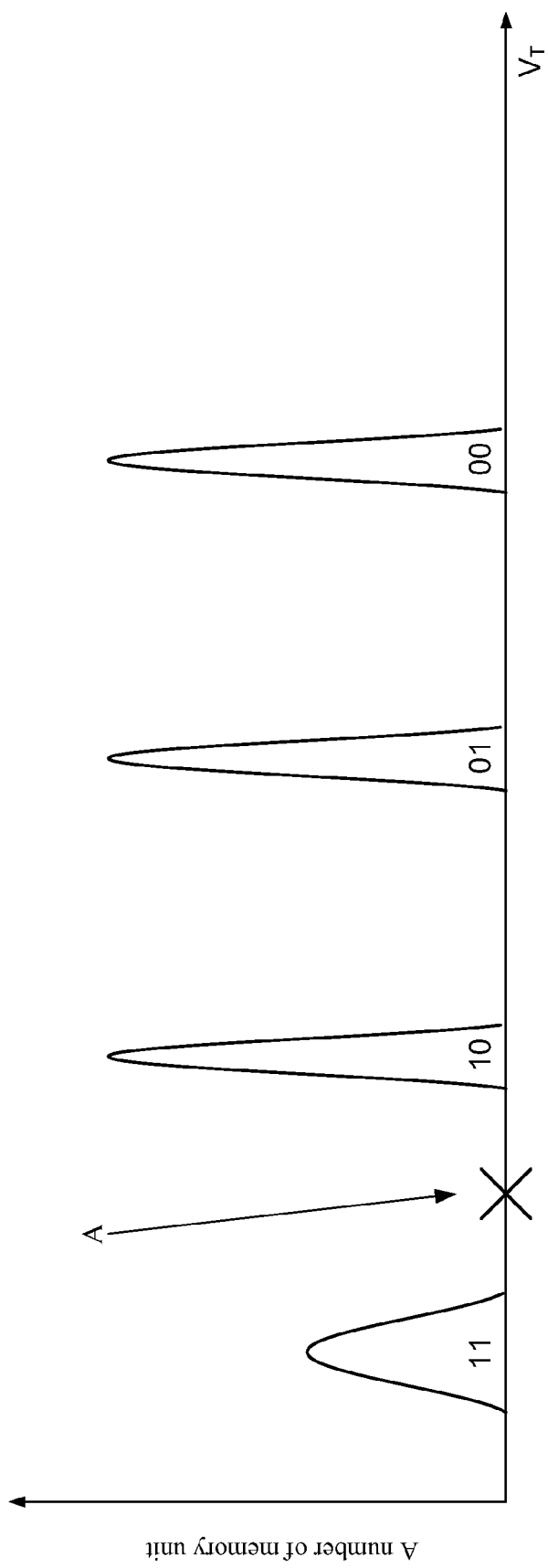
FIG. 10 illustrates logical voltage levels when the present invention is applied in a Multi-Level Cell (MLC) flash memory according to the present invention.

Referring to FIG. 10 illustrating logical voltage levels when the present invention applied in a Multi-Level Cell (MLC) flash memory according to the present invention, where vertical axis stands for a number of memory units and the horizontal axis stands for logical voltage $V_T$, four voltage levels representing logical levels "11," "10," "01," and "00" are shown, respectively. As shown, in order to facilitate reliably accessing an MLC flash memory, a value of bit A, for example, between logical levels "11" and "10" but neither in a domain region of logical levels "11" nor of logical levels "10", should not be selected as one of M data for retrieving N write-in data.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of facilitating reliable access of flash memory comprising the steps of:
    (a) determining whether data is to be read out or write in;
    (b) if the result of step (a) is to be write-in, coding a number of N write-in data to generate a number of K extra data, generating a first error correction code (ECC) by using an error-correcting operation to the N write-in data and K extra data, and storing the N write-in data and the generated K extra data into a data area of a target flash-memory page and the first ECC into a spare area of the target flash-memory page; and
    (c) if the result of step (a) is to be read out, allocating a plurality of counters in a main memory;
    (d) each bit in the data area of the target flash-memory page corresponding to a counter for accumulating a number of differences between the first and a second error correction codes (ECCs) associated to the target flash-memory page;
    (e) reading data from the data area of the target flash-memory page to generate the second ECC and reading the first ECC from the spare area of the target flash-memory page, counting with the counter a number of bit differences between the first ECC and the second ECC, and selecting a number of M data from the N write-in data and the K extra data as decoding factors to retrieve the N write-in data by using a reverse operation of the original adopted operation of coding in step (b).

2. The method of claim 1, wherein a capacity of each data area of a flash-memory page is 512×8 bits.

3. The method of claim 1, wherein the plurality of counters are composed of a counter array comprising sequential addresses.

4. The method of claim 1, wherein the coding of step (b) is analogous with an exclusive OR operation.

5. The method of claim 1, wherein the step (b) comprises the steps of:
    (e1) coding the N write-in data by using a random-coding operation to generate the K extra data;
    (e2) performing error-correcting with the N write-in data and the K extra data to generate the first error correction code; and
    (e3) storing the N write-in data and the K extra data into the data area of the target flash-memory page, and storing the first ECC into the spare area of the target flash-memory page.

6. The method of claim 1, wherein the step (e) comprises the steps of:
- (f1) reading the N write-in data and the K extra data stored in the data area of the target flash-memory page and corresponding first error correction code in the spare area;
- (f2) selecting a number of M data from the N write-in data and K extra data as factors for data retrieving;
- (f3) retrieving the N write-in data $D_1 \sim D_n$ by decoding the selected M data;
- (f4) determining whether the decoded data is correct, and if it is, go to step (f6), if not go to step (f5);
- (f5) determining whether a number of repeated times is over a threshold in regard to an upper limitation, and if it is, go to step (f51), if not, go to step (f52);
- (f51) alarming a failure of reading operation of the flash-memory page;
- (f52) selecting another set of M data from the N write-in data $D_1 \sim D_n$ and K extra data $T_1 \sim T_k$ stored in the data area, and repeating (f3);
- (f6) returning the correct data.

7. The method of claim 6, wherein the step (f2) comprising the steps of:
- (f21) clearing the counter corresponding to each bit in the data area of the target flash-memory page;
- (f22) reading the N write-in data and the K extra data stored in the data area of the target flash-memory page;
- (f23) reading the first ECC stored in the spare area of the target flash-memory page;
- (f24) calculating the second ECC based on the N write-in data and the K extra data;
- (f25) comparing the first ECC and the second ECC bit by bit;
- (f26) determining whether the compared bit of the first ECC and the second ECC is identical, if it is, go to step (f261), if not, go to step (f262);
- (f261) Since each bit in the ECC dominates a set of bits in the data area of the target flash-memory page, adding the value of those counters dominated by the bit by one;
- (f262) determining whether the compared bit is the last bit, if it is, go to step (f27), if not, go to step (f263);
- (f263) keeping on a comparison of the next bit; and
- (f27) determining whether to select the bit in the data area of the target flash-memory page based on the count of the corresponding counter.

* * * * *